United States Patent
Kroneder et al.

(10) Patent No.: US 9,627,343 B2
(45) Date of Patent: Apr. 18, 2017

(54) POWER SEMICONDUCTOR MODULE WITH SWITCHING DEVICE AND ASSEMBLY

(71) Applicant: Semikron Elektronik GmbH & Co., KG, Nürnberg (DE)

(72) Inventors: Christian Kroneder, Schwanstetten (DE); Björn Tauscher, Abendberg (DE); Alexej Walter, Nürnberg (DE); Christian Göbl, Nürnberg (DE); Harald Kobolla, Seukendorf (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 14/708,275

(22) Filed: May 10, 2015

(65) Prior Publication Data

US 2015/0325494 A1 Nov. 12, 2015

(30) Foreign Application Priority Data

May 9, 2014 (DE) .................. 10 2014 106 570

(51) Int. Cl.
*H05K 7/20* (2006.01)
*H01L 23/00* (2006.01)
(Continued)

(52) U.S. Cl.
CPC ............ *H01L 24/34* (2013.01); *H01L 23/043* (2013.01); *H01L 23/296* (2013.01);
(Continued)

(58) Field of Classification Search
CPC . G06F 1/181–1/182; H05K 7/20218–7/20381; H05K 7/20409;
(Continued)

(56) References Cited

U.S. PATENT DOCUMENTS 7,808,100 B2    10/2010  Bayerer
2005/0083655 A1*  4/2005  Jairazbhoy .......... H01L 23/3733
                                                    361/699
(Continued)

FOREIGN PATENT DOCUMENTS

DE          32 32 154 A1      3/1984
DE          602 09 423 T2     8/2006
(Continued)

*Primary Examiner* — Anthony Haughton
*Assistant Examiner* — Razmeen Gafur
(74) *Attorney, Agent, or Firm* — The Law Offices of Roger S. Thompson

(57) ABSTRACT

A power semiconductor module and an arrangement including it. The module includes a housing, a switching device having a substrate connected to the housing, a connecting device, load connection devices and a pressure device movable relative to the housing. The substrate has a first central passage and conductor tracks which are electrically insulated from one another. A power semiconductor component sits on a conductor track. The connecting device has two main surfaces and an electrically conductive film. The pressure device has a pressure body with a second passage, in alignment with the first passage and a first recess. A pressure element projects out of the recess, and presses onto a section of the second main surface. This section is within the surface of the component projects normal to the substrate. The first and second passages receive a fastener which force-fittingly fastens the module to the cooling device.

21 Claims, 5 Drawing Sheets

(51) Int. Cl.
*H01L 23/367* (2006.01)
*H01L 23/043* (2006.01)
*H01L 23/29* (2006.01)
*H01L 23/492* (2006.01)
*H01L 23/40* (2006.01)
*H01L 23/498* (2006.01)
*H01L 25/07* (2006.01)
*H01L 23/13* (2006.01)
*H01L 23/373* (2006.01)

(52) U.S. Cl.
CPC ...... *H01L 23/3672* (2013.01); *H01L 23/3675* (2013.01); *H01L 23/4006* (2013.01); *H01L 23/492* (2013.01); *H01L 23/4985* (2013.01); *H01L 24/90* (2013.01); *H01L 25/072* (2013.01); *H01L 23/13* (2013.01); *H01L 23/3735* (2013.01); *H01L 23/49861* (2013.01); *H01L 2023/4031* (2013.01); *H01L 2023/4056* (2013.01); *H01L 2023/4087* (2013.01); *H01L 2224/73263* (2013.01); *H01L 2224/8384* (2013.01); *H01L 2924/1203* (2013.01); *H01L 2924/13055* (2013.01); *H01L 2924/13091* (2013.01)

(58) Field of Classification Search
CPC  H05K 7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 2005/0128706 A1* | 6/2005 | Maly | | H01L 23/427 361/699 |
| 2005/0168949 A1* | 8/2005 | Tilton | | H01L 23/4735 361/699 |
| 2006/0007720 A1* | 1/2006 | Pfeifer | | H05K 7/20927 363/141 |
| 2006/0092611 A1* | 5/2006 | Beihoff | | B60L 11/12 361/698 |
| 2006/0120047 A1* | 6/2006 | Inoue | | H01L 23/4006 361/699 |
| 2006/0232942 A1* | 10/2006 | Nakatsu | | B60L 11/08 361/710 |
| 2008/0049476 A1* | 2/2008 | Azuma | | B60L 3/12 363/131 |
| 2008/0101032 A1* | 5/2008 | Tschirbs | | H01L 23/492 361/719 |
| 2008/0209931 A1* | 9/2008 | Stevens | | H05K 7/20763 361/699 |
| 2009/0168358 A1 | 7/2009 | Koike | | |
| 2009/0231811 A1* | 9/2009 | Tokuyama | | H01L 23/36 361/699 |
| 2009/0261472 A1* | 10/2009 | Bayerer | | H01L 24/06 257/719 |
| 2012/0008280 A1* | 1/2012 | Tokuyama | | H02M 7/003 361/689 |
| 2012/0050999 A1* | 3/2012 | Cooper | | H02M 7/003 361/722 |
| 2012/0106086 A1* | 5/2012 | Schloerke | | H01L 25/072 361/715 |
| 2012/0236500 A1* | 9/2012 | Higuchi | | H01L 23/473 361/699 |
| 2012/0327602 A1* | 12/2012 | Kulkarni | | H02M 7/003 361/700 |
| 2013/0003301 A1* | 1/2013 | Miyamoto | | H01L 23/473 361/699 |
| 2013/0050947 A1* | 2/2013 | Kadoguchi | | H01L 23/051 361/715 |
| 2013/0058044 A1* | 3/2013 | Watanabe | | H05K 5/006 361/714 |
| 2013/0077255 A1* | 3/2013 | Abe | | H01L 23/36 361/716 |
| 2013/0088128 A1* | 4/2013 | Nakano | | B62D 5/0406 310/68 R |
| 2013/0107455 A1* | 5/2013 | Cottet | | H05K 7/20672 361/694 |
| 2013/0135824 A1* | 5/2013 | Harubeppu | | H01L 23/34 361/709 |
| 2013/0176682 A1* | 7/2013 | Besendorfer | | H01L 23/18 361/707 |
| 2013/0215573 A1* | 8/2013 | Wagner | | H05K 7/20927 361/702 |
| 2013/0258602 A1* | 10/2013 | Hatai | | H05K 7/20409 361/715 |
| 2013/0279114 A1* | 10/2013 | Nishikimi | | B60K 6/28 361/699 |
| 2013/0301220 A1* | 11/2013 | Hotta | | H02K 11/33 361/699 |
| 2013/0314876 A1* | 11/2013 | Martin | | H05K 7/1432 361/714 |
| 2015/0069599 A1 | 3/2015 | Göbl | | |

FOREIGN PATENT DOCUMENTS

| | | |
|---|---|---|
| DE | 10 2009 002 992 A1 | 2/2011 |
| DE | 10 2010 62 556 | 6/2012 |
| DE | 10 2013 104 949 | 4/2014 |

* cited by examiner

POWER SEMICONDUCTOR MODULE WITH SWITCHING DEVICE AND ASSEMBLY

BACKGROUND OF THE INVENTION

1. Field of the Invention

The invention is directed to a power semiconductor module having at least one switching device which forms the base cell of the power semiconductor module. The invention further describes an arrangement which includes a power semiconductor module of this kind.

2. Description of the Related Art

The prior art discloses, by way of example in German Patent Application DE 10 2010 62 556 A1, a semiconductor circuit arrangement in the form of a power semiconductor module in which a housing has pressure elements with a pressure body, wherein the pressure body presses either directly onto a portion of a semiconductor component or onto a section of a substrate. U.S. Pat. No. 7,808,100 B2 likewise discloses pressing directly onto power semiconductor components by a pressing ram. One disadvantage of the two approaches is that direct pressure can be applied to a power semiconductor component, which is connected in an internally circuit-conforming manner by wire bonded connections, only in a highly selective manner on account of the limited area available in real applications. Therefore, the current-carrying capacity of the internal connection is reduced since no bonding connections can be established at the pressure point.

German patent application DE 10 2013 104 949 B3, in particular, basically discloses a base cell. This base cell is designed as a switching device having a substrate, a power semiconductor component, a connecting device, load connection devices and a pressure device. In this case, the substrate has electrically insulated conductor tracks and a power semiconductor component is arranged on one conductor track. The connecting device is designed as a composite film comprising an electrically conductive and an electrically insulating film, and has a first and a second main surface. The switching device is connected to the connecting device in an internally circuit-conforming manner. The pressure device has a pressure body with a first recess, a pressure element being arranged such that it projects out of the recess, wherein the pressure element presses onto a section of the second main surface of the composite film and, in this case, this section is arranged within the surface of the power semiconductor component to project along the normal direction of the power semiconductor component.

SUMMARY OF THE INVENTION

It is an object of the invention is to provide an improved power semiconductor module and also an arrangement comprising the same, having at least one switching device, wherein pressure can be introduced onto the base cell in a particularly simple and effective manner.

The inventive power semiconductor module includes a housing, a switching device having a substrate which is connected to the housing, a power semiconductor component which is arranged on the substrate, a connecting device, load connection devices and a pressure device which is moveable in relation to the housing in a direction normal to the substrate. In this case, the substrate has a first central passage opening and also conductor tracks which are electrically insulated from one another, wherein a power semiconductor component is arranged on a conductor track and is cohesively connected to the conductor track.

In this case, the connecting device has first and second main surfaces and an electrically conductive film, wherein the switching device is connected in an internally circuit-conforming manner by the connecting device. Furthermore, the pressure device has a pressure body with a second passage opening, which is in alignment with the first passage opening, and with a first recess. The pressure device further has a pressure element which projects out of the recess, and presses onto a section of the second main surface of the connecting device. In this case, this section is arranged within the surface of the power semiconductor component in projection along a direction normal to the substrate. In this case, the first and second passage openings receive a fastener which fastens the power semiconductor module on a cooling device in a force-fitting manner.

It goes without saying that the features cited in the singular, in particular the power semiconductor component and the connecting device, can also be present severally in the inventive power semiconductor module, provided that this is not precluded per se. In particular, a plurality of power semiconductor components can be arranged on one or more conductor tracks of a substrate.

In a preferred embodiment, the housing has a third passage opening aligned with the first and second passage openings, wherein at least the first and second passage openings are receive the fastener.

Furthermore, it may be advantageous when the connecting device is designed as a film stack having at least one electrically conductive film and at least one electrically insulating film, wherein the conductive and insulating films alternate.

It is preferred when the first recess in the pressure body is designed exclusively as a depression starting from a first main surface of the pressure body, which main surface faces the substrate, or as a depression starting from the first main surface with a cutout, which passes through the pressure body to the second main surface, with an opening arranged there. In this case, the pressure element can completely or approximately completely fill the recess in the pressure body. As an alternative, the pressure element can, at the same time or in addition, project out of the cutout in the pressure body at its second main surface.

Similarly, the housing or one of the load connection devices can have first guide elements, and the pressure device can have second guide elements, wherein these first and second guide elements correspond to one another and permit movement of the pressure device with respect to the housing with arranged load connection devices only in a direction normal to the substrate.

In a particularly preferred embodiment, the pressure body can be composed of a high-temperature-resistant thermoplastic material, in particular of polyphenylene sulphide, and the pressure element can be composed of a silicone rubber, in particular of liquid silicone.

The pressure body preferably has a second recess on its second main surface, the base of the second recess forming an auxiliary surface, wherein a flat metal body with a further passage opening which is in alignment with the other passage openings is arranged in the second recess.

In order to design an efficient pressure device which, when it is loaded for the power semiconductor component, is not destroyed, it is particularly advantageous when the surface area of the section takes up at least about 20%, in particular at least about 50%, of the surface of the power semiconductor component.

It is further preferred that the lateral extent of the pressure device in the two orthogonal directions parallel to the substrate plane be lower than the lateral extent of the substrate as such.

In order to form particular protection against environmental influences, it may also be necessary for the top face of the substrate, including the conductor tracks of the substrate, the power semiconductor component and the connecting device, to be encapsulated in a moisture-tight manner by an encapsulation compound.

It is likewise possible, on account of the particularly effective introduction of pressure, for a thermally conductive paste to be arranged between the substrate, in particular that part of the substrate on which the power semiconductor components are arranged, and the cooling device at a thickness of less than about 20 μm, preferably less than about 10 μm, most preferably less than about 5 μm.

It is particularly preferred when the respective pressure body is more wide than high, that is to say when the ratio of lateral extent to vertical extent of the pressure body before being provided with a cooling device has a ratio of about 3 to 1, preferably of about 5 to 1.

For certain applications, the top face of the substrate, including the conductor tracks of the substrate, the power semiconductor component and the connecting device, can be encapsulated in a moisture-tight manner by an encapsulation compound.

For the purpose of making external contact, sections of the load connection devices can project through the housing and there form external load contact devices.

The arrangement according to the invention has a power semiconductor module such as described above, a cooling device and a fastener, wherein the fastener introduces force onto the pressure device and therefore the pressure device connects the substrate to the cooling device in a force-fitting manner.

In this case, a thermally conductive paste can be arranged between the substrate and the cooling device at a thickness of less than about 20 μm, in particular of less than about 10 μm, in particular of less than about 5 μm.

The cooling device can preferably be designed as a base plate of the power semiconductor module or as an external heat sink which is associated with the power semiconductor module.

In a preferred variant, the housing of the power semiconductor module has at least one pin which projects into an associated third recess in the cooling device or in a further heat sink and prevents rotation of the housing in relation to the cooling device or in relation to the further heat sink.

It goes without saying that the various embodiments of the invention, that is to say the power semiconductor module and also the arrangement comprising the same, can be realized individually or in any desired combinations in order to achieve improvements. In particular, the features mentioned above and explained here or below can be used not only in the specified combinations but also in other non-exclusive combinations or on their own, without departing from the scope of the present invention.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
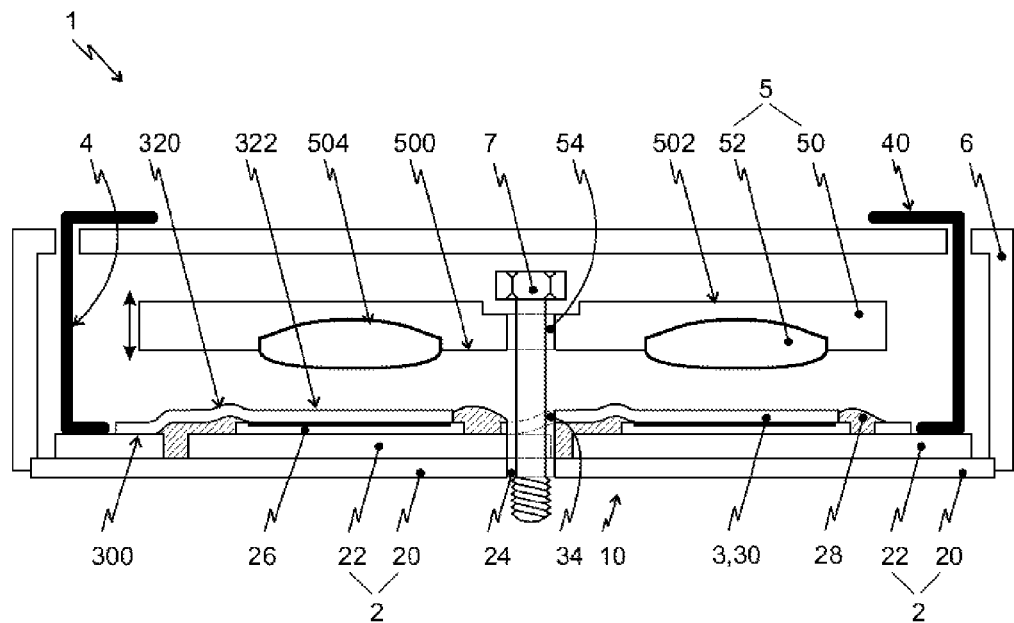
FIG. 1 shows a first embodiment of a power electronics power semiconductor module according to the invention.

FIG. 1 shows a first embodiment of a power semiconductor module 1 according to the invention with a switching device 10. FIG. 1 shows a substrate 2 which is designed in a manner which is fundamentally routine in the art, having an insulating material body 20 and conductor tracks 22 which are arranged on insulating material body 20, are each electrically insulated from one another and have different potentials, in particular load potentials, but also auxiliary, in particular switching and measurement, potentials, of the switching device during operation. Specifically, three conductor tracks 22 with load potentials as are typical for a half-bridge topology are illustrated here. The substrate has a first passage opening 24 which is arranged centrally or substantially centrally. A respective power switch 26, which can be designed in a manner which is routine in the art as an individual switch, for example as a MOSFET or as an IGBT with a power diode which is connected back-to-back in parallel, is arranged on two conductor tracks 22, the power switches being illustrated here. The power switches 26 are electrically conductively connected to the conductor tracks 22 in a manner which is routine in the art, preferably by a sintered connection.

The internal connections of switching device 10 are formed by a connecting device 3 from an electrically conductive film 30 which here forms individual conductor track sections which are not, either mechanically or electrically, connected to one another. These conductor track sections connect, in particular, the respective power semiconductor component 24, more precisely the contact areas of power semiconductor component 24 on that side which is averted from substrate 2, to conductor tracks 22 of substrate 2. In a preferred embodiment, the conductor track sections are cohesively connected to the contact areas by a sintered connection. It goes without saying that connections between power semiconductor components 24 and between conductor tracks 22 of the substrate 2 can also be formed in the same way. Particularly in the case of pressure-sintered connections, it is advantageous, as illustrated, to arrange an insulating compound 28 at the edge region of power semiconductor component 24. This insulating compound 28 can also be arranged in the intermediate spaces between conductor tracks 22. In this case, that surface of film 30 which faces substrate 2 forms a first main surface 300, while the opposite surface forms a second main surface 320.

For the purpose of external electrical connection, power semiconductor module 1 has load and auxiliary connection elements, wherein only load connection elements 4 are illustrated. Load connection elements 4 are formed, purely by way of example, as shaped metal bodies which are cohesively connected, advantageously likewise connected by a sintered connection, to a conductor track 22 of substrate 2 by way of a contact foot. Parts of connecting device 3 itself can also be designed as load or auxiliary connection elements in principle. The auxiliary connection elements, such as gate or sensor connections, can otherwise be formed in a manner which is routine in the art.

Power semiconductor module 1 further has a housing 6 which is connected to substrate 2 by way of an adhesive connection. Load connection elements 4 project through housing 6 and form external load contact devices 40 there. These load contact devices 40 can be designed in a manner which is routine in the art in principle.

A pressure device 5 has a first main surface 500, which faces substrate 2, and a second main surface 502, which is averted from substrate 2, and in this case is illustrated in a manner spaced apart from connecting device 3 for reasons of clarity. Pressure device 5 is composed of a pressure body 50 and a plurality of pressure elements 52, two pressure elements being illustrated. Pressure body 50 is of particularly rigid design in order to be able to pass pressure which is introduced onto it to pressure elements 52 in a homogeneous manner. To this end, and against the background of thermal loading during operation of the power semiconductor module, pressure body 50 is preferably composed of a high-temperature-resistant thermoplastic material, most referably polyphenylene sulphide. Pressure elements 52 have to be able to exert a substantially constant pressure during operation and, in this case, in particular at different temperatures. To this end, pressure elements 52 are preferably composed of a silicone rubber, in particular of a so-called liquid silicone. All variants of the pressure device as are known from the prior art can be provided in principle here.

Pressure device 5 has a second passage opening 54. Second passage opening 54 is arranged in alignment with first passage opening 24 in substrate 2. As a result, a fastener 7, which is designed as a screw as is routine in the art in this case, can extend through the two passage openings 24, 54 to fasten power semiconductor module 1 on a cooling device, not illustrated here (see, e.g., FIG. 2). This is implemented, by way of example, by substrate 2 being fastened on the cooling device by pressure device 5 and then housing 6 being provided and connected to substrate 2. As an alternative, cf. FIG. 3, housing 6 can have a third passage opening 64 which is in alignment with first and second passage opening 24, 54 and through which screw 7 can be moved, turned and thereby screwed into a heat sink.

Figure 2:
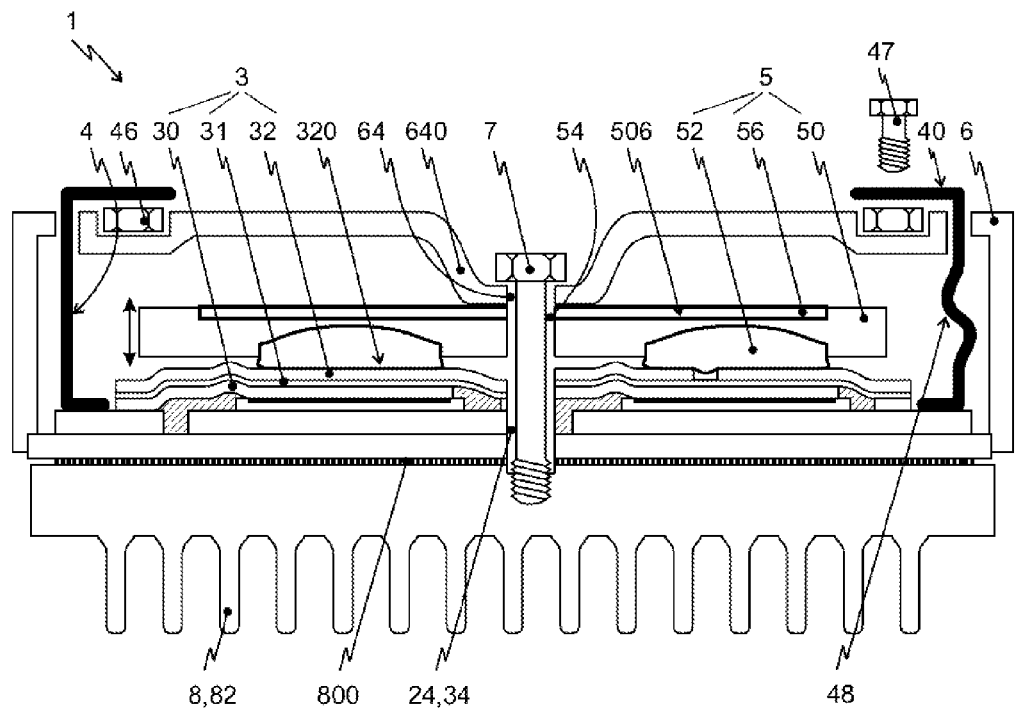
FIG. 2 shows a first arrangement according to the invention with a second power semiconductor module.

FIG. 2 shows a first arrangement according to the invention with a second power semiconductor module 1. This arrangement has a power semiconductor module 1 similar to that according to FIG. 1, and also a heat sink, which forms the cooling device 8, and a schematically indicated pressure introduction device 7.

The internal connections of switching device 10 are designed by a connecting device 3 from a composite film which has, in an alternating manner, electrically conductive films 30, 32 and electrically insulating films 31. In this embodiment, composite film 3 has precisely two conductive films 30, 32 and one insulating film 31 arranged between them. The surface of composite film 3, which surface faces substrate 2, in this case forms first main surface 300, while the opposite surface forms second main surface 320. In particular, conductive films 30, 32 of connection device 3 are intrinsically patterned and therefore form conductor track sections which are electrically insulated from one another.

By way of example, a load connection element 4, in this case the right-hand side load connection element, has a meandering section 48 in its profile, meandering section 48 acting as a tension or pressure relief mechanism. Furthermore, load contact devices 40 for connection to a screw connection which is routine in the art are illustrated here, wherein a nut 46 is provided in a fixed or moving manner in housing 6, an associated screw 47 engaging into nut 46 through load contact device 40. Screw 47 is illustrated at a distance for reasons of clarity.

In this embodiment, pressure body 50 of pressure device 5 additionally has a metal insert 56 which, without restricting the generality of this disclosure, is arranged in a second recess 506 in second main surface 502 of pressure device 5 in this case. In this case, the base of second recess 506 forms an auxiliary surface. The entire pressure body 5, that is to say including metal insert 56, has a second passage opening 54.

Housing 6 has a third passage opening 64 which is arranged in alignment with first and the second passage opening 24, 54. A screw 7 is arranged such that it extends through these passage openings, screw 7 being screwed into a cooling device 8, 80 and therefore, by housing 6, applying pressure to pressure device 5, and, by pressure device 5 and connecting device 3, pushing substrate 2, precisely at the points at which power semiconductor components 26 are arranged, onto cooling device 80, and thereby connecting substrate 2 to cooling device 8 in a force-fitting manner. This demonstrates the essential advantage of inventive power semiconductor module 1, specifically a simple central introduction of force which indirectly presses power semiconductor components 26 onto cooling device 80 by substrate 2.

Pressure body 50 of pressure device 5 distributes the pressure uniformly over pressure elements 52 in this case, pressure elements 52 for their part pressing onto sections 322 of second main surface 320 of connecting device 3. According to the invention, these sections 322 of connecting device 3 to which pressure is applied are selected in such a way that they, and therefore their surface of extent as viewed in the normal direction of substrate 2, are arranged within the surface of power semiconductor component 26. Therefore, pressure element 52 presses onto the respective power semiconductor component 26 by the connecting device 3 in such a way that power semiconductor component 26, more precisely substrate 2 which is situated beneath it, is pressed onto heat sink 7, and therefore the thermal contact from the power semiconductor component 24 to heat sink 7 is optimal.

Owing to the introduction of pressure onto pressure elements 52, pressure elements 52 are deformed, wherein it is also possible in this case for the lateral extent of pressure elements 52 to increase. In the unloaded state, that is to say without pressure being introduced thereto, cf. FIG. 1, pressure body 52 has a ratio of its lateral extent to its vertical extent of about 4 to 1. In the loaded state, that is to say the state in which pressure is applied, and owing to the deformation of pressure body 52 which results, this ratio changes to approximately 5 to 1 in this case.

A thermally conductive layer, preferably a thermally conductive paste 800, is arranged between substrate 2 and cooling device 8. Owing to the inventive design of power semiconductor module 1, this layer can be designed to be very thin, for example at a thickness in the unassembled state of about 10 μm. Owing to the introduction of pressure, the layer is at least partially forced, in particular, beneath the power semiconductor components, as a result of which the transfer of heat from substrate 2 to heat sink 8 is particularly efficient.

In this case, cooling device 8 is illustrated as a heat sink 80 for air cooling, but it can likewise be designed as a heat sink for liquid cooling.

Figure 3:
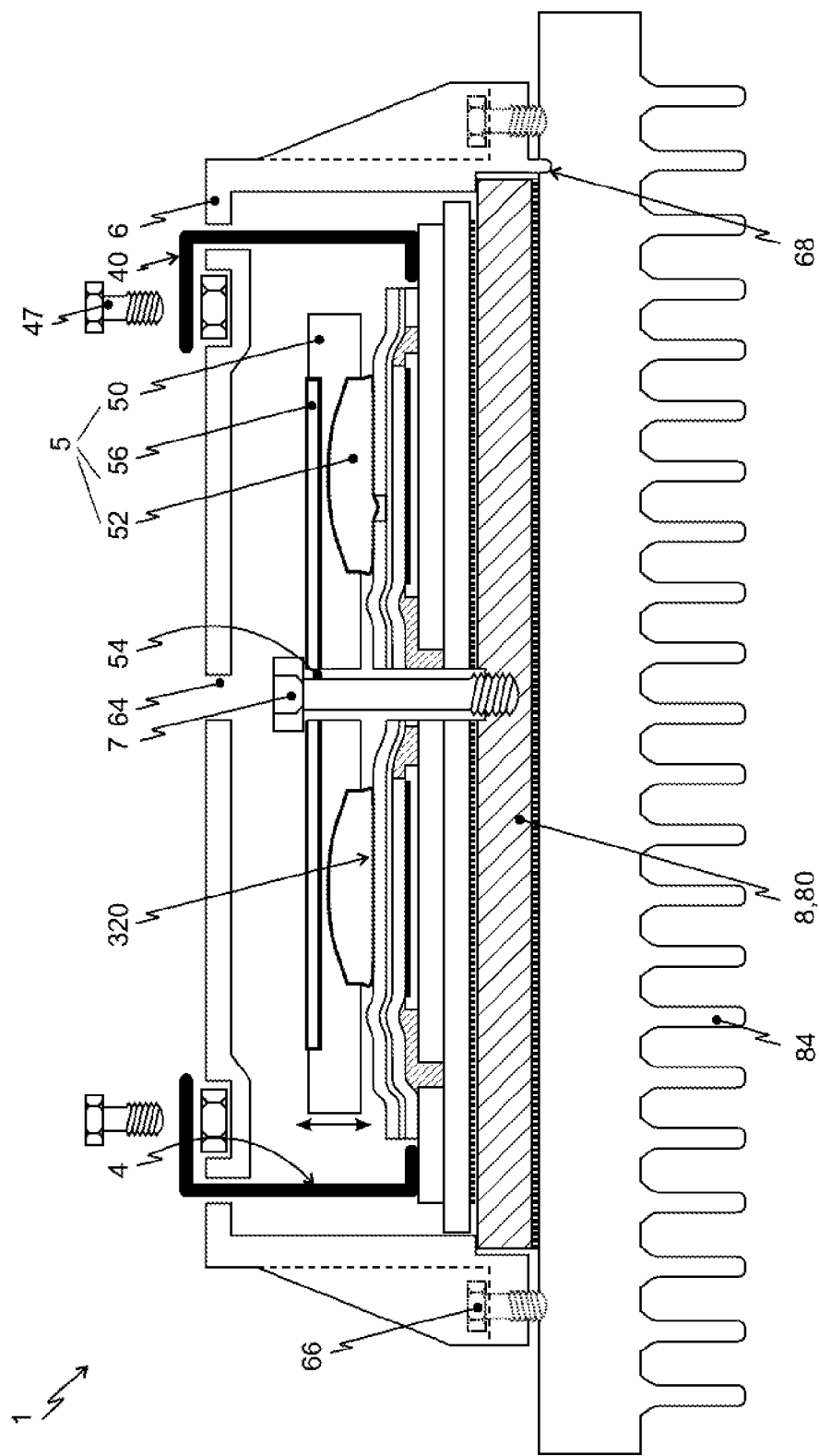
FIG. 3 shows a second arrangement according to the invention with a third power semiconductor module.

FIG. 3 shows a second arrangement according to the invention with a third power semiconductor module 1. In this case, cooling device 8 is designed as a base plate 80 of power semiconductor module 1 itself, which base plate 80, like substrate 2 of power semiconductor module 1, but to an even greater extent, serves to spread the heat which is produced by line losses in power semiconductor components 26, and to pass said heat to a further heat sink 84.

In this embodiment, housing 6 of power semiconductor module 1 is connected to cooling device 8 and has screw-connection devices 66 for connection to heat sink 82. Housing 6 of power semiconductor module 1 further has at least one pin 68 which projects into an associated third recess in cooling device 8, in this case heat sink 82, and is designed to prevent rotation of housing 6 relative to cooling device 8. A pin of this kind can likewise be provided in an embodiment according to FIG. 2 or others.

Thermally conductive paste is arranged between substrate 2 and cooling device 8 at a thickness of about 10 μm. A thin thermally conductive paste layer 70 of this kind is possible, taking into account latent local sagging of substrate 2, in particular owing to the pressure being introduced onto power semiconductor component 26 in direction normal to substrate 2, and therefore power semiconductor component 26, and not a surrounding area, being in optimal thermal contact with cooling device 8. Thermally conductive paste is again arranged between cooling device 8 and the further heat sink 84, but at a thickness of more than about 50 p.m.

The further embodiment of power semiconductor module 1 itself corresponds to a combination of those according to FIGS. 1 and 2.

Figure 4:
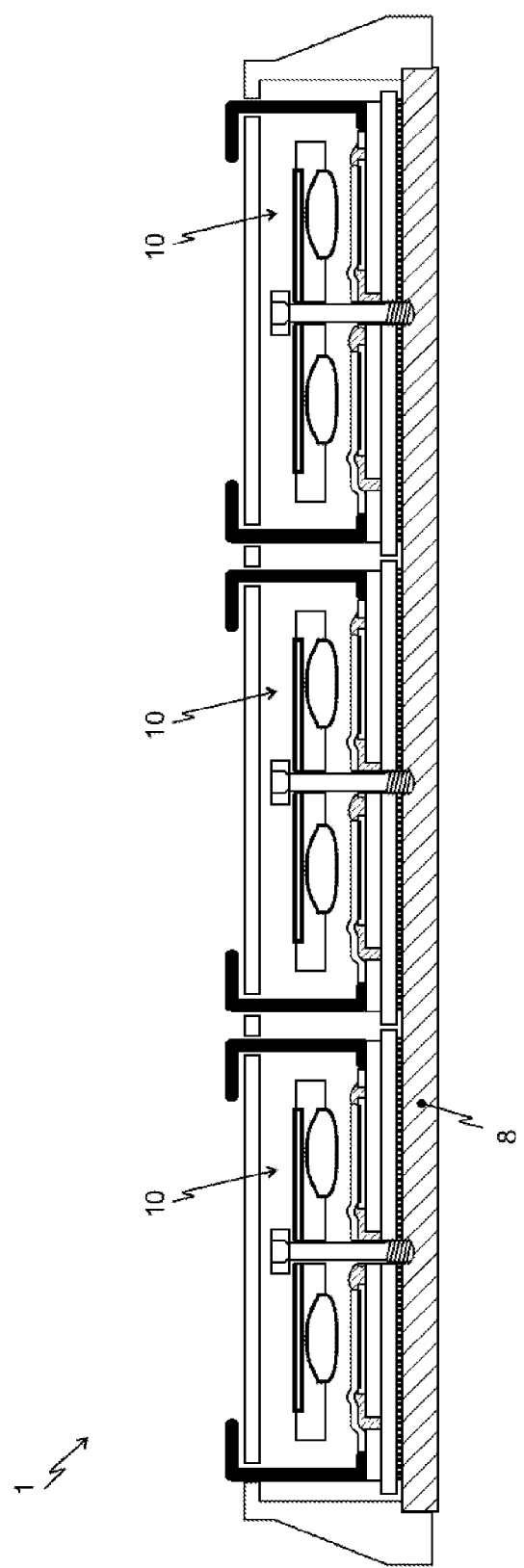
FIG. 4 shows a further arrangement according to the invention of a power semiconductor module with three switching devices.

FIG. 4 shows a further arrangement of inventive power semiconductor module 1 with three switching devices 10, but corresponds in principle to the embodiment of FIG. 3. The embodiment of FIG. 4 can form, for example, a 3-phase power semiconductor module, while that according to FIG. 3 forms a 1-phase power semiconductor module.

Figure 5A:
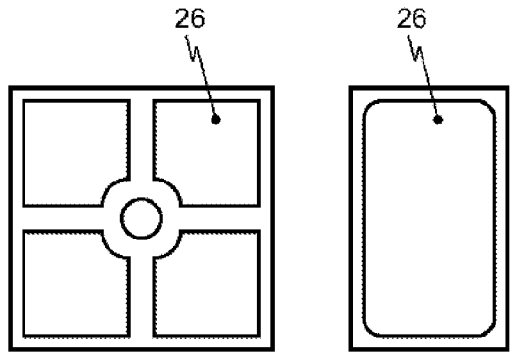
FIGS. 5a-d show plan views of details of a switching device in various sectional planes.

FIGS. 5*a-d* show a plan view of a power electronics switching device 10 in different sectional planes. The sectional plane according to FIG. 5*a* shows two power semiconductor components 26 which are, however, typically arranged, in a manner not illustrated, on a common conductor track of a substrate. Without restricting the generality, the power semiconductor components are in this case a transistor with a central gate connection area and emitter connection areas which surround the gate connection area, and a diode with a cathode connection area.

Figure 5B:
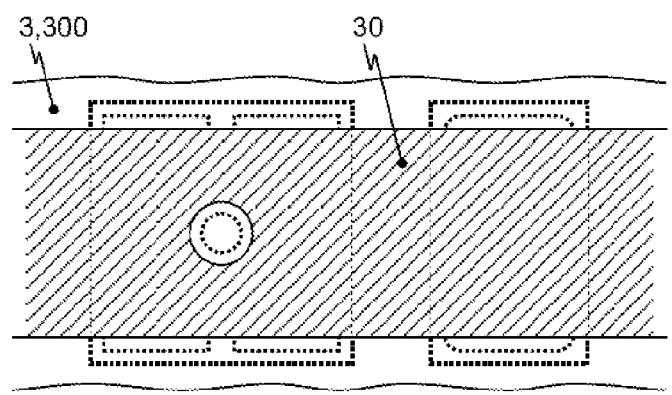

FIG. 5*b* shows the first intrinsically patterned electrically conductive film 30 of connecting device 3. Film 30 forms an electrically conductive connection between the emitter connection areas of the transistor and the cathode connection area of the diode. In this case, the gate connection area of the transistor is cut out.

Figure 5C:
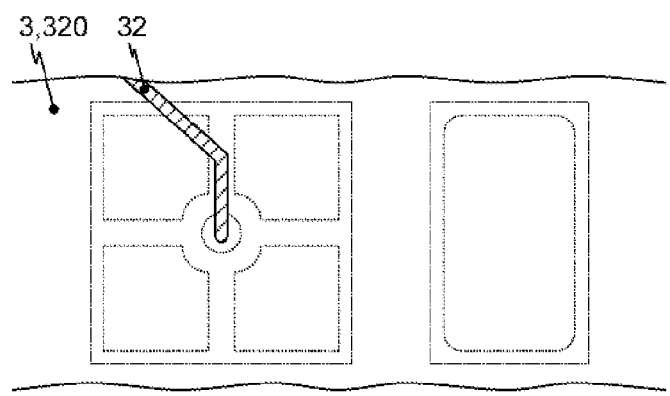

FIG. 5*c* shows the second intrinsically patterned electrically conductive film 32 of connecting device 3. Film 32 forms an electrically conductive connection to the gate connection area of the transistor.

Figure 5D:
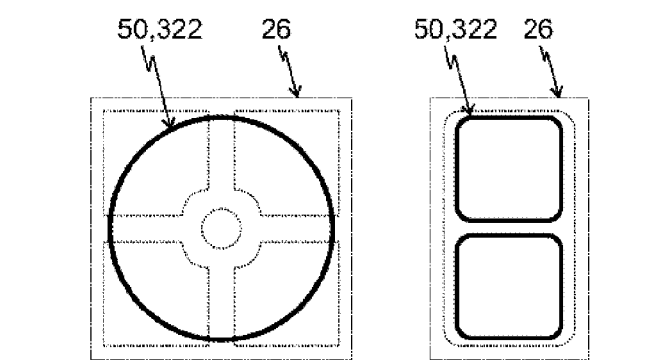

FIG. 5*d* branches, as it were, the footprint of contact elements 50, which are associated with power semiconductor components 26, of the contact device, wherein only one contact element 50 is associated with the transistor on account of its square basic shape, and two contact elements 50 are associated with the diode on account of its rectangular basic shape. The respective footprint corresponds to those sections 322 on second main surface 302 of connecting device 3 which are arranged in alignment with the power semiconductor components 26 in a direction normal to the substrate, and in this case are projected onto the respective power semiconductor component 26. It is clear here that the area of the footprint, that is to say that area which is intended for introducing pressure, covers as large a portion of the area of the power semiconductor component 26 as possible, without going beyond this.

Figure 6:
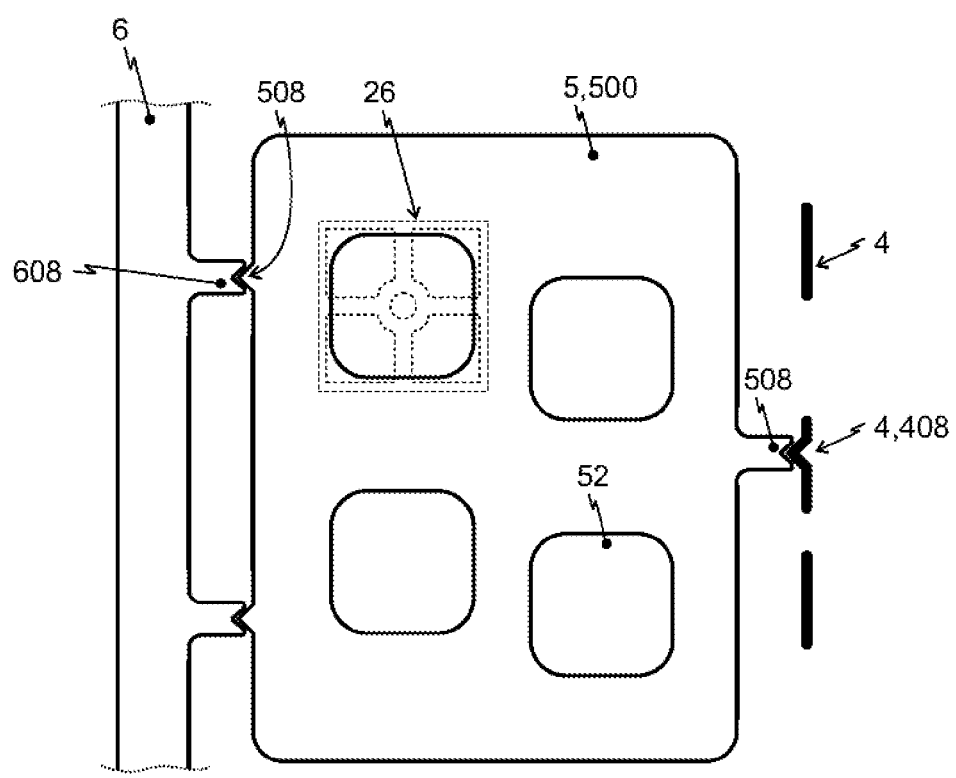
FIG. 6 shows a plan view of parts of a power semiconductor module according to the invention.

FIG. 6 shows a plan view of parts of a power semiconductor module 1 according to the invention. FIG. 6 illustrates pressure device 5 with pressure elements 50 and schematically indicates a power semiconductor component 26 which is associated with a pressure element 50. Said figure also illustrates a detail of a housing 6 and also three load connection elements 4.

In order to restrict the movement of pressure device 5 relative to housing 6 with arranged load connection devices 4 only in a direction normal to the substrate, in this case into or out of the plane of the drawing, two variants are illustrated, it being possible for the variants to be provided, in principle, in an alternating manner or at the same time. This movement is schematically illustrated in FIGS. 1 and 2 by a double-headed arrow.

In a first variant, housing 6 has first guide elements 608, and pressure device 5 has second guide elements 508, wherein first and second guide elements 608, 508 are arranged so as to correspond to one another. In this embodiment, first guide element 608 is designed as a v-shaped groove, and second guide element 508 is designed as a lug which moves in the normal direction in this groove.

In a second variant, a load connection device 4 has first guide elements 408, and pressure device 5 has second guide elements 508, wherein first and second guide elements 408, 508 are configured to complement one another. In this embodiment, first guide element 408 is designed as a convex portion of the load connection element, which convex portion runs in the normal direction, second guide element 508, a lug with a notch, being designed such that it can move along the convex portion.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
   a housing;
   a switching device;
   a substrate connected to said housing, said substrate having a first central passage opening and a plurality of conductor tracks which are electrically insulated from one another;
   a power semiconductor component arranged on, and cohesively connected to, one of said plurality of conductor tracks of said substrate;
   a connecting device having first and second main surfaces and an electrically conductive film between said first and second main surfaces, said connecting device connecting said switching device in an internally circuit-conforming manner;
   a plurality of load connection devices;
   a pressure device which is movable relative to said housing in a first direction generally normal to said substrate, and having a pressure body with a second passage opening, said second passage opening being in alignment with said first passage opening, said pressure device further having a first recess;
   a pressure element arranged in said recess, such that it projects out of said recess, said pressure element pressing onto a section of said second main surface of said connecting device, said section being arranged within the surface of said power semiconductor component and projecting therefrom in a second direction generally normal to said substrate; and
   a fastener disposed at least partially within said first and second passage openings for fastening said power semiconductor module on a cooling device in a force-fitting manner.

2. The power semiconductor module of claim 1,
   wherein said housing has a third passage opening which is disposed in alignment with said first and second passage openings; and
   wherein said fastener is also disposed at least partially within said third passage opening.

3. The power semiconductor module of claim 1,
   wherein said connecting device comprises a film stack of at least three layers, at least one of said at least three layers being an electrically conductive film, and at least another one of said at least three layers being an electrically insulating film; and
   wherein said at least three layers of said film stack are alternating between one of said at least one conductive film and one of said at least one of said insulating film.

4. The power semiconductor module of claim 1, wherein said first recess in said pressure body consists of a depression starting from a first main surface of said pressure body, which main surface faces said substrate.

5. The power semiconductor module of claim 1, wherein said first recess in said pressure body comprises a depression starting from a first main surface of said pressure body, which main surface faces said substrate, and further comprises a cutout, which passes through said pressure body to a second main surface of said pressure body, with an opening disposed therein.

6. The power semiconductor module of claim 1, wherein at least one of said housing and one of said plurality of load connection devices has first guide elements, and said pressure device has second guide elements, wherein said first and second guide elements co-operate to permit a movement of said pressure device with respect to said housing with arranged load connection devices only in a direction normal to said substrate.

7. The power semiconductor module of claim 1, wherein said pressure body is composed of a high-temperature-resistant thermoplastic material and said pressure element is composed of a silicone rubber.

8. The power semiconductor module of claim 7, wherein said high-temperature-resistant thermoplastic material is polyphenylene sulphide, and said silicone rubber is liquid silicone.

9. The power semiconductor module of claim 1
   wherein said pressure body has a second recess on a second main surface thereof, said second recess having a base which forms an auxiliary surface; and
   wherein the power semiconductor module further comprises a flat metal body with a further passage opening therein, which further passage opening is in alignment with said first and second passage openings and is disposed in said second recess.

10. The power semiconductor module of claim 1 wherein the surface area of said section of said second main surface of said connecting device takes up at least about 20% of the surface of said power semiconductor component.

11. The power semiconductor module of claim 10 wherein the surface area of said section of said second main surface of said connecting device takes up at least about 50% of the surface of said power semiconductor component.

12. The power semiconductor module of claim 1, wherein the ratio of lateral extent to vertical extent of said pressure body is at least about 3 to 1.

13. The power semiconductor module of claim 12, wherein the ratio of lateral extent to vertical extent of said pressure body is at least about 5 to 1.

14. The power semiconductor module of claim 1
   wherein said conductor tracks are located on a top face of said substrate; and
   wherein said top face of said substrate, including said conductor tracks, said power semiconductor component and said connecting device, is encapsulated in a moisture-tight manner by an encapsulation compound.

15. The power semiconductor module of claim 1, wherein sections of said load connection devices project through said housing and form external load contact devices there.

16. An arrangement comprising:
    a power semiconductor module having
      a housing;
      a switching device;
      a substrate connected to said housing, said substrate having a first central passage opening and a plurality of conductor tracks which are electrically insulated from one another;
      a power semiconductor component arranged on, and cohesively connected to, one of said plurality of conductor tracks of said substrate;
      a connecting device having first and second main surfaces and an electrically conductive film between said first and second main surfaces, said connecting device connecting said switching device in an internally circuit-conforming manner;
      a plurality of load connection devices;

a pressure device which is movable relative to said housing in a first direction generally normal to said substrate, and having a pressure body with a second passage opening, said second passage opening being in alignment with said first passage opening, said pressure device further having a first recess; and a fastener disposed at least partially within said first and second passage openings; and a cooling device;

wherein said fastener introduces force onto said pressure device so that said pressure device connects said substrate to said cooling device in a force-fitting manner.

17. The arrangement of claim 16, further comprising:
a thermally conductive paste arranged between said substrate and said cooling device and having a thickness of less than about 20 µm.

18. The arrangement of claim 17, wherein said thickness of said thermally conductive paste is less than about 10 µm.

19. The arrangement of claim 18, wherein said thickness of said thermally conductive paste is less than about 5 µm.

20. The arrangement of claim 16, wherein said cooling device is at least one of a base plate of said power semiconductor module and an external heat sink which is associated with said power semiconductor module.

21. The arrangement of claim 16, wherein said housing includes at least one pin which projects into at least one of an associated third recess in said cooling device and in a heat sink and prevents rotation of said housing in relation to at least one of said cooling device and said heat sink.

* * * * *